(12) United States Patent
Short et al.

(10) Patent No.: US 6,347,146 B1
(45) Date of Patent: Feb. 12, 2002

(54) NOISE REDUCING

(75) Inventors: William R. Short, Ashland; Robert Preston Parker, Westboro; Richard A. Kirkpatrick, Lynnfield, all of MA (US)

(73) Assignee: Bose Corporation, Farmington, MA (US)

( * ) Notice: Subject to any disclaimer, the term of this patent is extended or adjusted under 35 U.S.C. 154(b) by 0 days.

(21) Appl. No.: 07/744,324

(22) Filed: Aug. 13, 1991

(51) Int. Cl.[7] ................................................ H04H 5/00
(52) U.S. Cl. ......................... 381/15; 455/222; 455/266
(58) Field of Search ........................... 381/15; 455/222, 455/223, 224, 304, 266, 307; 375/104

(56) References Cited

U.S. PATENT DOCUMENTS

| | | | | |
|---|---|---|---|---|
| 3,978,412 A | * | 8/1976 | Frerking | 455/222 |
| 4,154,980 A | * | 5/1979 | Schmidt et al. | 381/13 |
| 4,203,072 A | * | 5/1980 | Beningfield et al. | 455/312 |
| 4,208,547 A | * | 6/1980 | Simeau | 381/13 |
| 4,356,567 A | * | 10/1982 | Eguchi et al. | 455/266 |
| 4,479,251 A | * | 10/1984 | Dawson | 455/223 |
| 4,528,698 A | * | 7/1985 | Fraser | 455/266 |
| 4,654,885 A | * | 3/1987 | Meszko et al. | 455/223 |
| 4,718,115 A | * | 1/1988 | Inoue | 455/222 |
| 4,845,750 A | * | 7/1989 | Ecklund et al. | 381/15 |
| 4,856,084 A | * | 8/1989 | Richards, Jr. | 455/311 |

* cited by examiner

Primary Examiner—Edward Lefkowitz
(74) Attorney, Agent, or Firm—Fish & Richardson P.C.

(57) ABSTRACT

A noise reducing AM receiver has a receiving stage for receiving an AM signal of carrier frequency separated from that in an adjacent channel by a predetermined spacing and that may have a noise component. A detecting stage is coupled to the receiving stage for detecting at least a first portion of the received AM signal. A filter is coupled to the detecting stage for extracting a spectral component from at least a first portion of the received AM signal. A noise detector is coupled to the filter for detecting the presence of a predetermined amount of noise in the spectral component and for providing a blanking control signal in the presence of at least the predetermined amount of noise. A first noise blanker is responsive to the blanking control signal to process at least one portion of the received signal in response to the control signal to reduce the audibility of the noise component.

40 Claims, 14 Drawing Sheets

NOISE REDUCING

This invention relates to the reception of amplitude modulated radio signals, and more particularly to methods for reducing received noise in these signals.

The most general form of an broadcast AM signal is:

$$x(t)=[1+m_i(t)]\cdot\cos \omega_c t + m_q(t)\cdot\sin \omega_c t$$

where $x(t)$ is the broadcast amplitude modulated RF signal, $\omega_c$ is the carrier frequency, $m_i(t)$ is the in-phase audio signal, and $m_q(t)$ is the quadrature audio signal, and where $m_i(t)$ and $m_q(t)$ are typically constrained:

$$-1.0 \leq m_i(t) \leq 1.25 \text{ and } |m_q(t)| \leq 1.0$$

For a conventional monophonic broadcast, $m_i(t)$ is the audio voltage of the program being broadcast, and $m_q(t)$ is nominally zero. At the receiver, an envelope detector may be used to recover an approximation to the $m_i(t)$ signal, called the E signal, or a synchronous detector may be used to recover $m_i(t)$ exactly, which is called the in-phase signal I. The various stereophonic AM broadcast systems use $m_i(t)$ and $m_q(t)$ differently, but typically, the left and right channel audio signals are summed and processed to create $m_i(t)$, and the left and right signals are subtracted and processed to create $m_q(t)$. In the receiver, synchronous detectors recover $m_i(t)$ and $m_q(t)$, to form the in-phase signal I and the quadrature phase signal Q, which are ultimately processed to yield the left and right channel audio signals.

An example of a stereo AM broadcast system is the CQUAM system (U.S. Pat. Nos. 4,218,586, 4,371,747). The sum and difference audio signals are predistorted at the transmitter to create $m_i(t)$ and $m_q(t)$. This distortion exactly corresponds to the distortion introduced when an envelope detector is used to demodulate the CQUAM broadcast signal. Thus, the typical mono receiver, which used an envelope detector, receives a low distortion mono signal. A CQUAM stereo receiver recovers the E, I, and Q signals, and uses the E and I signals to remove the distortion on the Q signal. The E and processed Q signals are summed and subtracted to create undistorted left and right channel audio signals.

There are many forms of noise, both natural and man-made, that may disrupt an AM broadcast. Natural noise, from cosmic and atmospheric sources can add broadband noise to the received signal. Noise from lightning discharges may add impulse like noise. Man-made noise may be broadband, or may have strong spectral components, depending upon its source.

One common source of man-made noise is synchronized to the AC power line frequency (60 Hz in North America). A typical example is a power transmission line having a faulty insulator which allows an electrical discharge once in each half cycle of the AC power waveform. The actual discharge is random in character, resulting in RF energy spread over a wide spectrum, even though the timing of the discharge is repetitive and stable from period to period.

When this sort of noise is added to an AM RF signal and demodulated, the resulting demodulated audio has a series of spike-like waveforms due to the noise. Whereas the timing of these spikes is typically very uniform and is synchronized with the AC power waveform, the amplitude and wave shape of the spikes vary with each discharge. Some spikes might be positive, and some might be negative. Some spikes may not be observable because their amplitude is so low compared to the broadcast program material. This variability is due to the random nature of the generated noise, and the random phase variations between each noise impulse and the carrier.

The result of this train of noise impulses is that a wide band noise signal is added to the demodulated audio signals. A useful model of this process is a white noise source that is gated on briefly at a rate synchronous with the AC power waveform and added to the demodulated audio. On an AM broadcast, this sort of RF noise results in an objectionable buzz-like noise in the demodulated audio. This type of noise is common, and in automobile reception may be especially obnoxious. The AC power lines parallel to the road act as a transmitting antenna, re-transmitting the noise from a single point noise source over an extensive length of road. Thus, what might have been a brief interruption to AM listening becomes an extended duration during which time reception is impaired or interrupted.

Typically, noise blankers have two components: one, which detects the presence of noise, and a second, which minimizes the audibility of the noise.

Noise blankers typically operate on the principle that normal modulation may not exceed +125% or −100%, whereas noise may. So, one commonly used approach senses the audio signal level at the output of the AM detector. When the magnitude of the output audio exceeds a level corresponding to modulation greater by some amount than 100%, the output level is clamped, or set to zero.

This approach may cause the duration of the noise impulse, and thus the duration for which the detector output is clamped, to be longer than necessary. This is because the finite bandwidth of the tuned stages in the receiver (typically dominated by the IF stages) causes the original noise pulse, which may have been quite brief, to be stretched in time by the low-pass action of the IF stages. Thus, the effect of even a brief noise impulse is comparable to the length of the impulse response of the low-pass filter equivalent of the IF pass band.

One approach that minimizes the effects of the pulse lengthening has been recently commercialized by Sprague Electric Company, in the form of a noise blanker IC (ULN3845A). This approach detects noise at the output of the RF amplifier stage, which is generally wideband. Because of the wideband nature of the signal at this point, the noise impulse has not experienced much lengthening. Noise impulses above some threshold level are detected, and the output of the RF amplifier is set to zero for the duration of the impulse, effectively blanking it. Since this interruption to the RF level may cause a disruption in the audio at the detector output, the detector output is sampled and held for the duration of the noise impulse. To compensate for the time delay and pulse stretching in the IF stages, the sample and hold control voltage is also delayed and stretched.

The invention has the advantage of providing a noise blanking system that operates on noise pulses substantially lower in level than ±100% modulation. In addition, the invention provides a blanking action that is quite inaudible, doing little harm to the audio waveform. The system of the invention is effective on noise that is synchronized to the AC power line, and on other types of noise as well. Furthermore, when a receiver according to the invention is tuned to a weak station where a stronger station is closely located in frequency, it can still blank out noise pulses in the weak signal that are lower in amplitude than the RF stage's 100% modulation level, which may be governed by the stronger signal. A combination synchronous-asynchronous noise reduction system can reduce noise even further than the synchronous system alone. The system of the invention may be advantageously combined with "monkey chatter" reduction circuitry.

Other features and advantages will become apparent from the following detailed description when read in connection with the accompanying drawing in which.

Figure 1:
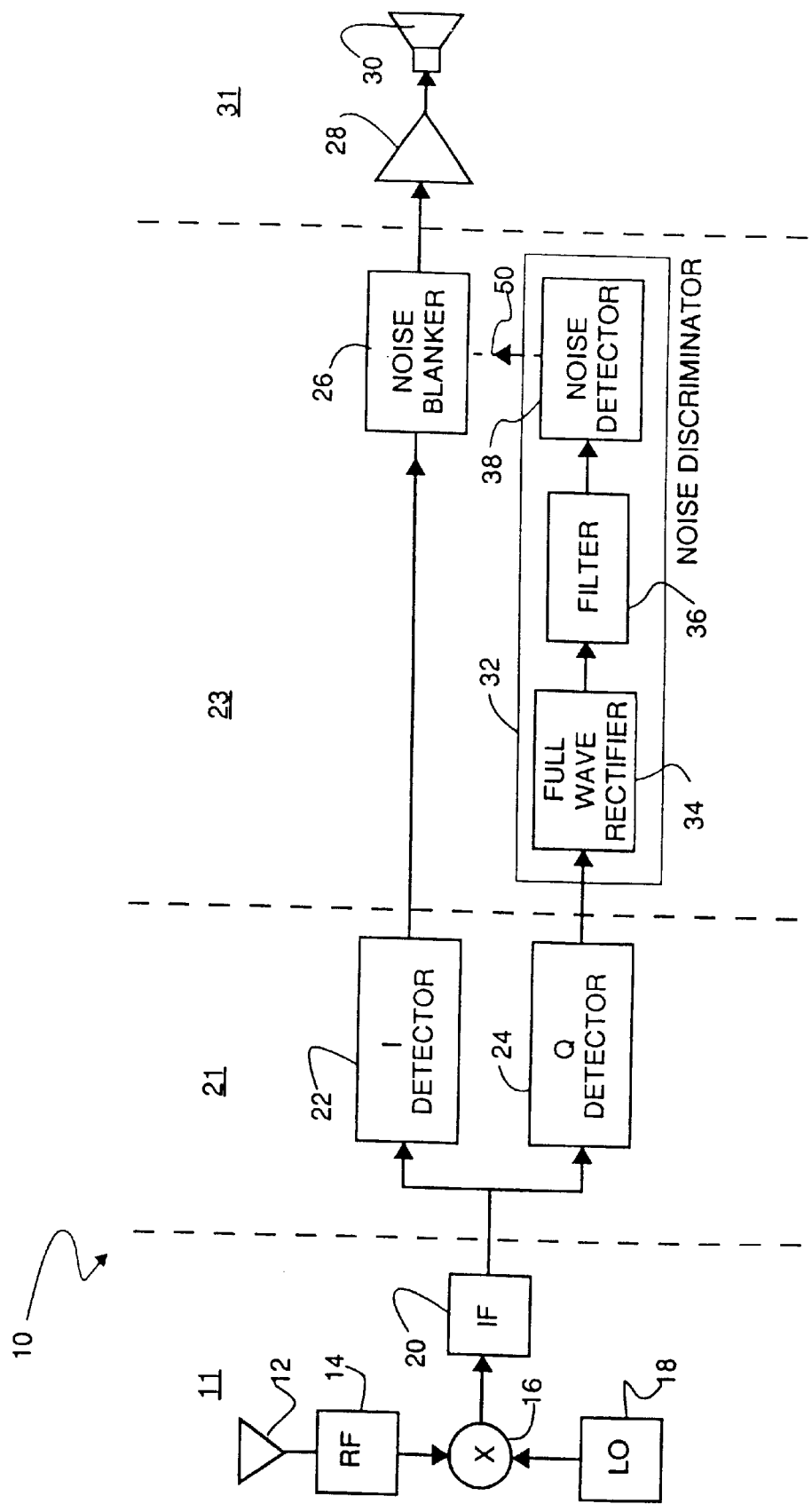
FIG. 1 is a block diagram of an AM receiver incorporating noise reducing according to the invention.

Referring to FIG. 1, a receiver 10 with noise reducing capabilities includes receiving stage 11 that provides a received signal, such as an intermediate-frequency (IF) AM signal, to detecting stage 21. Detecting stage 21 supplies detected signals to noise blanking stage 23 which furnishes a noise-blanked output signal, such as a noise-blanked audio signal, to output stage 31.

Receiving stage 11 includes antenna 12 that provides received signals to RF amplifier 14. Mixer 16 receives and mixes amplified RF signals from RF amplifier 14 and local oscillator 18 to provide an output IF signal to IF amplifier 20.

Detecting stage 21 includes I and Q detectors 22, 24, which receive the output of the IF amplifier and extract the appropriate signal components.

Blanking stage 23 includes noise blanker 26, which receives the output of I detector 22, and noise discriminator 32, which receives the output of Q detector 24. Noise discriminator 32 provides a noise blanker control output signal 50 to noise blanker 26 which provides a noise blanked signal to output stage 31. Output stage 31 may include an amplifier 28, which feeds speakers 30.

Noise discriminator 32 includes full-wave rectifier 34 that provides a rectified signal to filter 36, and noise detector 38 responsive to filter 36, which provides the noise blanker control output signal 50.

Figure 2:
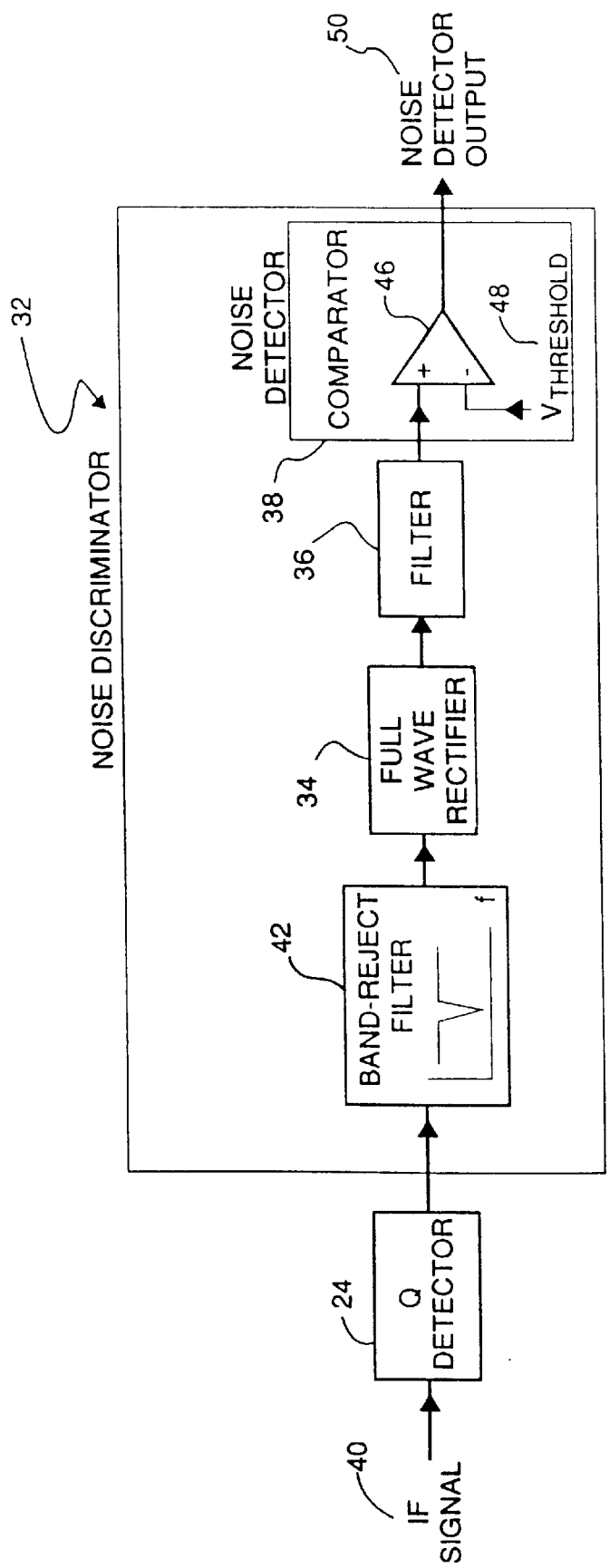
FIG. 2 is a block diagram showing a noise discriminator for use in the corresponding block shown in FIG. 1.

Referring to FIG. 2, noise discriminator 32 may also include a band-reject filter 42, connected to receive the output of quadrature detector 24, that provides a band-reject filtered signal to full wave rectifier 34. Noise detector 38 may include comparator 46 with a non-inverting input responsive to filter 36 and an inverting input responsive to threshold voltage 48 to provide the output signal 50.

Figure 4:
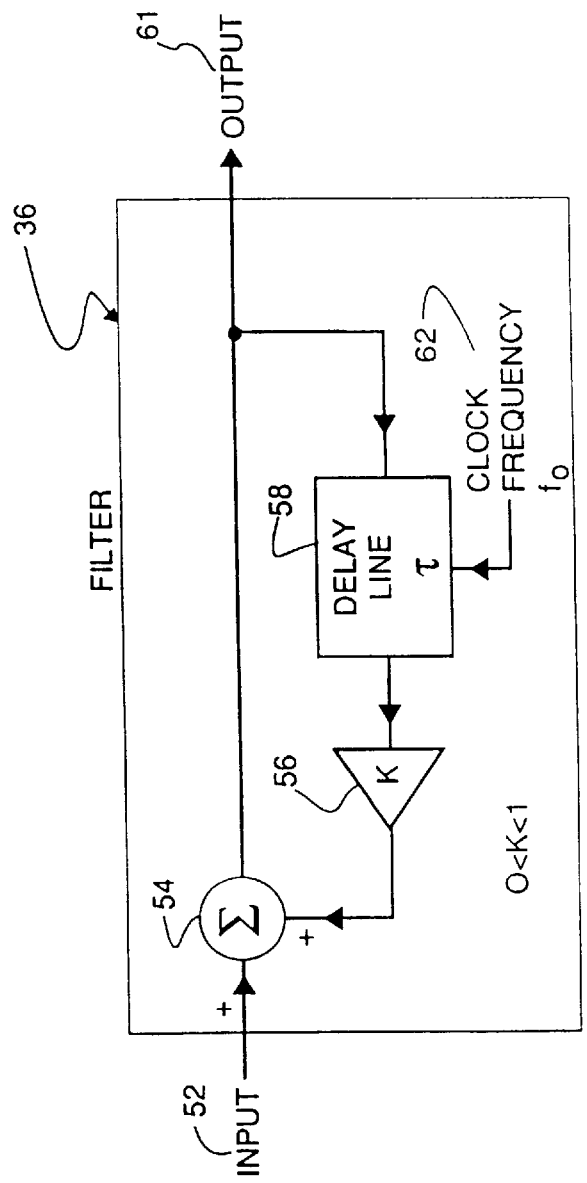
FIG. 4 is a block diagram of a filter block for use in the corresponding block of FIG. 1.

Referring to FIG. 4, filter 36 may include a delay line 58, clocked by a clock frequency 62, which provides its output to a gain element 56. Summer 54 receives the filter input 52 and the output of gain element 56 and provides a resulting sum output to delay line 58 and filter output 61.

Figure 7:
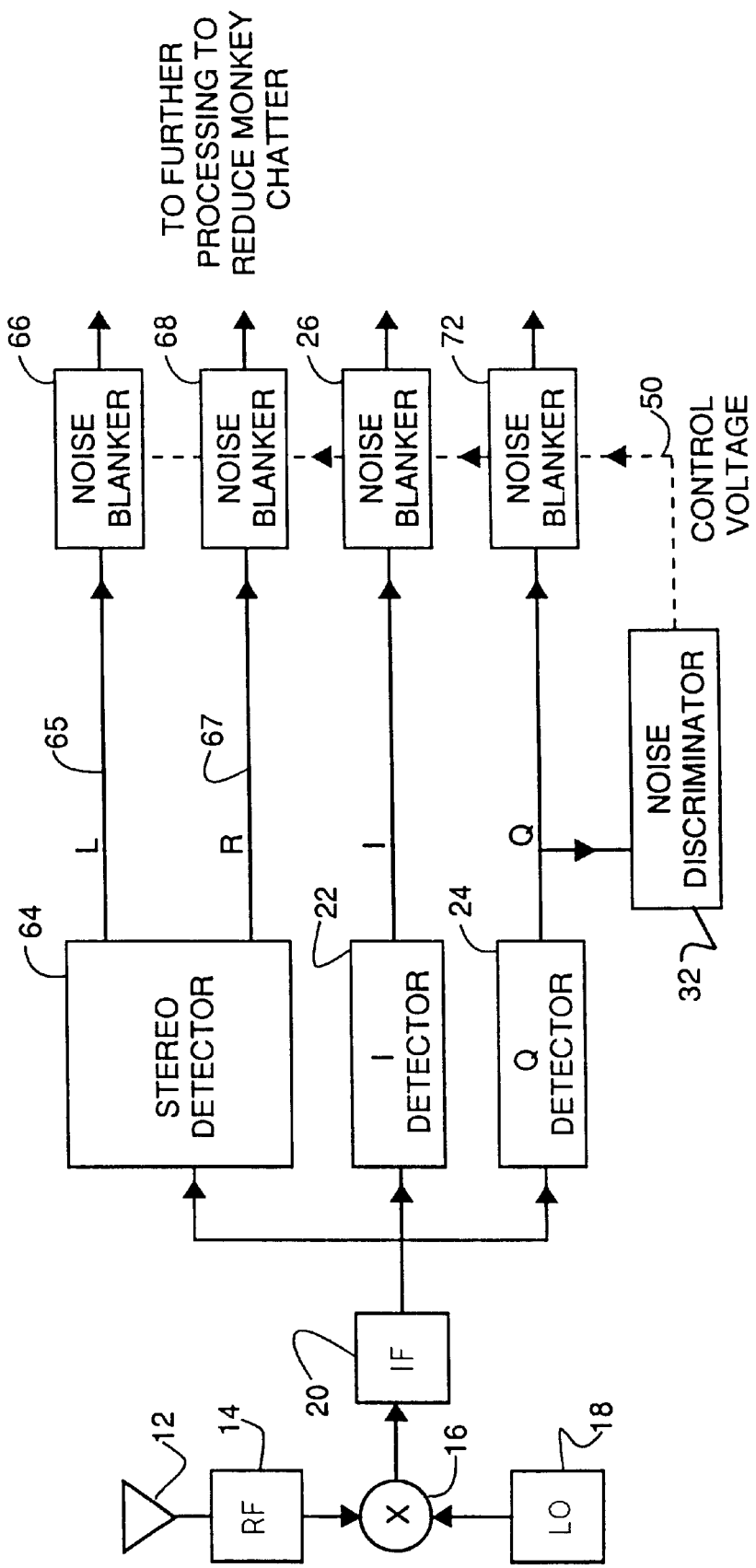
FIG. 7 is a block diagram of a portion of an AM receiver incorporating the noise reducing feature of the invention for inclusion in a receiver incorporating circuitry for the reduction of monkey chatter.

The present invention may be used in conjunction with the noise reducing system in co-pending application entitled "Reducing Audible Noise in Stereo Receiving", Serial No. 07/687,290, filed Apr. 18, 1991, incorporated herein by reference. Referring to FIG. 7, an embodiment of the invention for inclusion in a receiver incorporating circuitry for the reduction of "monkey chatter" includes a second noise blanker 72 responsive to the quadrature detector 22, which provides a blanked version of the Q signal for further processing to reduce "monkey chatter." The receiver also includes a stereo detector 64, with right and left outputs 67, 65 which similarly feed third and fourth noise blankers 68, 66 to provide blanked versions of the right and left outputs for further processing.

Figure 8:
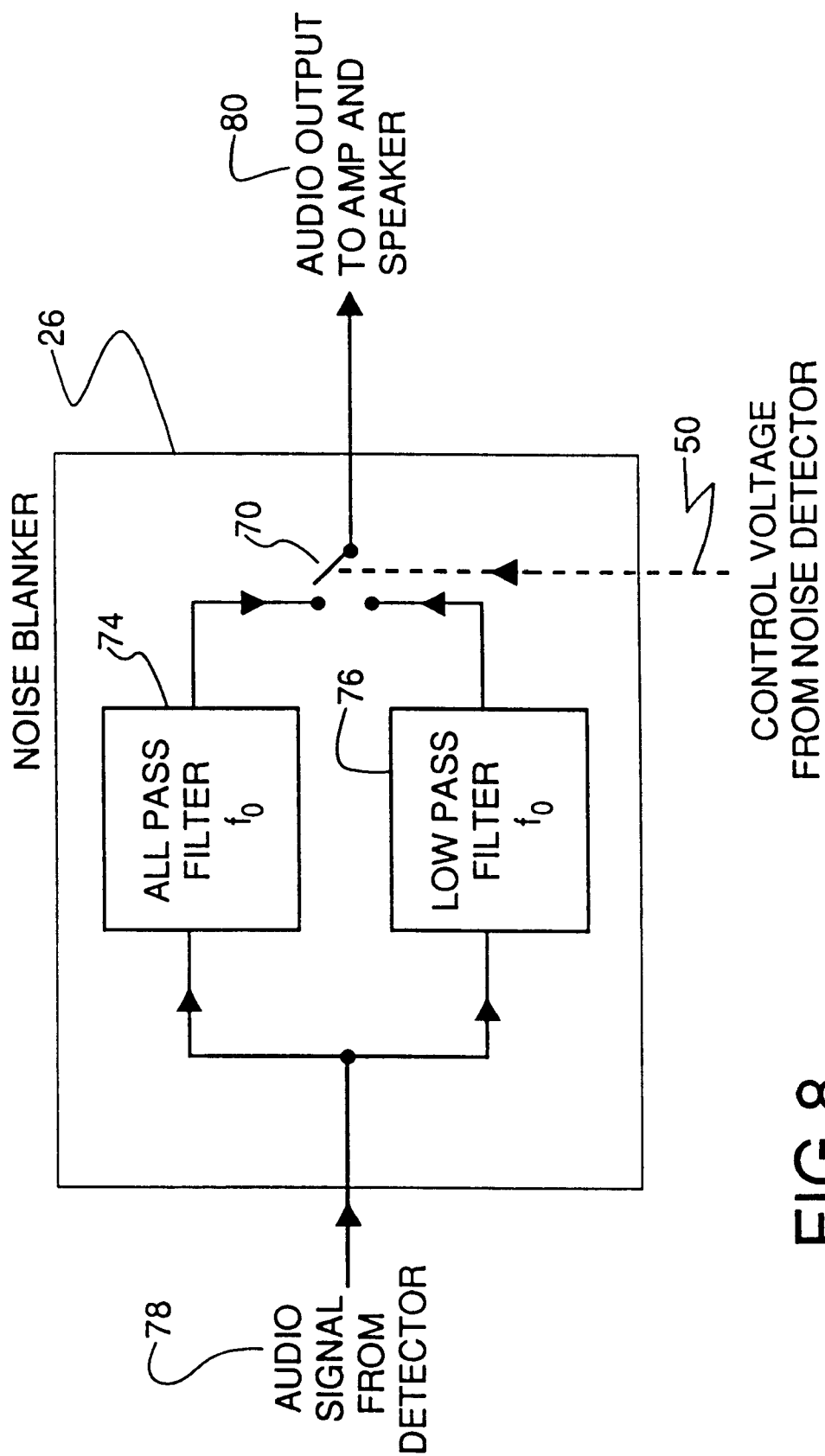
FIG. 8 is a block diagram of a noise blanker for use in the corresponding block of FIG. 1.

Referring to FIG. 8, noise blanker 26 may include an all-pass filter 74 and a low-pass filter 76, each receiving the audio signal 78 from a detector. Switch 70 receives the output of the two filters and selects between them in response to control signal 50 from noise discriminator 32 to provide a selected output 80.

Figure 9:
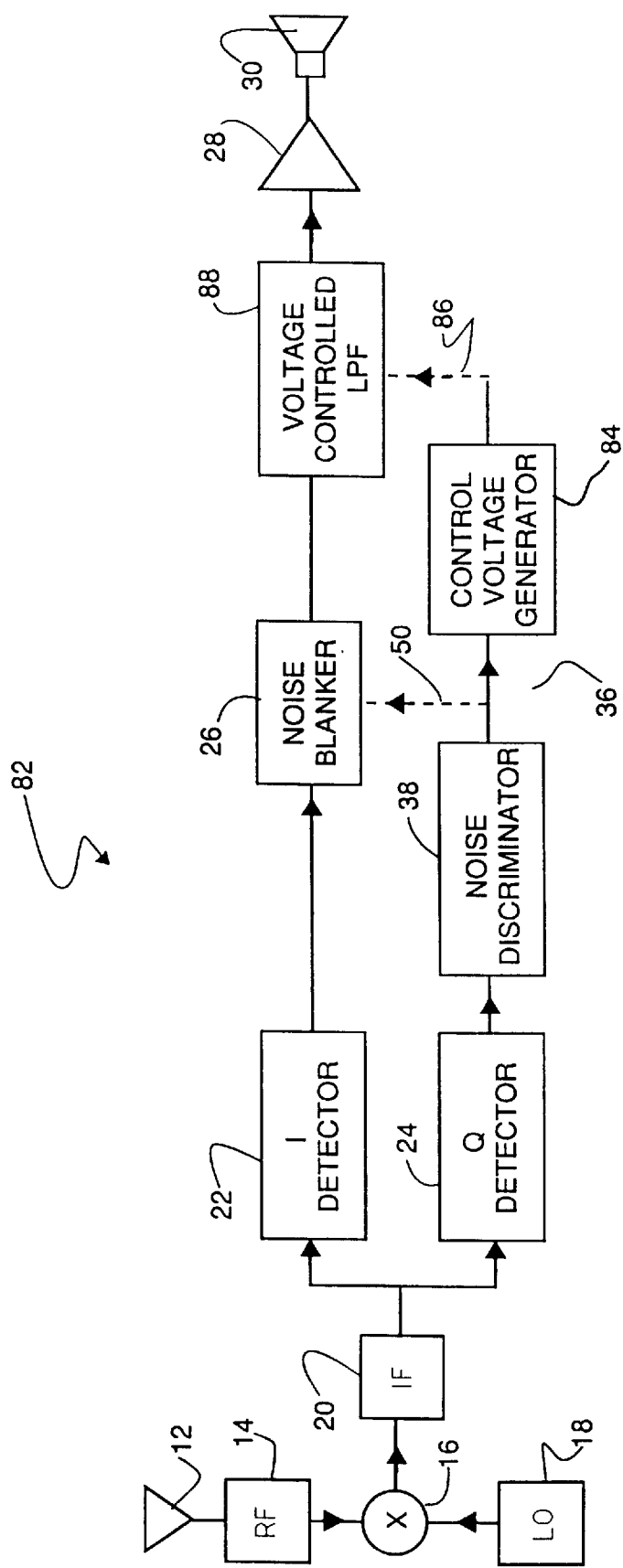
FIG. 9 is a block diagram of a receiver as shown in FIG. 1, with further noise reducing circuitry.

Referring to FIG. 9, the receiver of FIG. 1 may further include an adjustable filter 88, such as a voltage-controlled low-pass filter. Control voltage generator 84 receives control signal 50 and generates a filter control voltage 86 for controlling adjustable filter 88.

Referring to FIG. 1, the circuit operates as follows. Receiving stage 11 feeds IF signals to I and Q detectors 22, 24. Noise discriminator 32 senses noise in the presence of other signals and operates noise blanker 26 to minimize the audibility of the noise. Noise discriminator 32 senses the noise impulses on the Q signal, at the output of quadrature detector 24. For a mono station, without interference, there should be no Q signal present, and low level noise impulses are then readily detectable at the output of Q detector 24.

Since impulses have random polarity and amplitude at the output of Q detector 24, the spectrum of the noise is broadband. By full-wave-rectifying the detected Q signal, rectifier 34 provides noise impulses of the same polarity, although their amplitude remains random. While the spectrum of this rectified signal is still broadband, it now has significant peaks at the AC power line frequency and its multiples.

This rectified signal feeds filter 36, which passes spectral components at the AC power line frequency and its harmonics, while blocking components at other frequencies. The output of filter 36 is a signal characterizing the amplitude and timing of the interfering noise impulses. This signal feeds noise detector 38, which senses the presence and timing of noise impulses and may be used to create control voltage 50 feeding noise blanker 26, which performs actions to hide the effects of the noise.

There are two general classes of actions that may be performed. The first may be described as synchronous, operating in a time interval comparable to the length of each noise impulse, and at substantially the same time as each noise impulse. The second is asynchronous, operating more slowly, and remaining in operation over the entire time that a series of noise impulses is being received.

An example of synchronous action is setting the audio output to zero during each noise impulse interval. Another example is sample and hold, where, during each noise impulse interval, the audio output voltage is held constant at the voltage occurring just prior to the onset of the noise impulse. These sorts of blanking actions are shown to operate on the I signal in FIG. 1. Equivalently, the E signal could be used. The resulting noise blanked audio signal feeds amplifier 28 and speaker 30.

Still referring to FIG.1, the noise detection and noise blanking aspects of the system will be described in more detail. Noise is sensed on the output of quadrature detector 24 providing the Q signal. It is also possible to use any of the other detector outputs, such as the in-phase I output, the envelope E output, or even the stereo L and R outputs. The Q signal is preferred because it typically has the lowest level of signal, making the noise impulses easier to detect. A monophonic station typically broadcasts no Q signal. Unintentional Q modulation may occur in a poorly operated transmitter or antenna. Stereo stations intentionally broadcast a Q signal, which typically is a processed form of the L–R difference channel audio.

Even higher levels of Q signal may be encountered in the presence of interference. An adjacent channel interferer may create a large Q detector output, centered at 10 kHz (the RF carrier channel spacing in North America), with the typical "monkey chatter" spectrum above and below that frequency. Co-channel interference can create low frequency Q output.

The Q detector output appears to be the best signal to use for sensing noise, despite all these possible sources of Q output. In all the instances described above, the amount of Q channel modulation is less than or equal to the I channel modulation, making it easier to sense noise on the Q signal.

It is preferable to maximize the signal-to-noise ratio at the input of noise detector circuit 38, treating impulse noise as the desired signal. The desired signal is the noise impulses, and the undesired signal or noise for rejection is the Q modulation, which may in fact be broadcast program material. Noise discriminator 32 improves signal-to-noise ratio at input of noise detector 38 by passing the noise impulses while blocking the Q modulation.

Referring to FIG. 2, the Q channel is filtered by band-reject filter 42 to reduce the effects of adjacent channel interference. The center frequency of the filter is set to be the same as the RF carrier channel spacing (10 kHz in North America). The bandwidth of the filter is made as wide as possible, to eliminate as much of the interfering station's modulation as possible. However, the filter bandwidth must not be so wide as to affect substantially the timing or duration of the received noise impulses.

Figure 3:
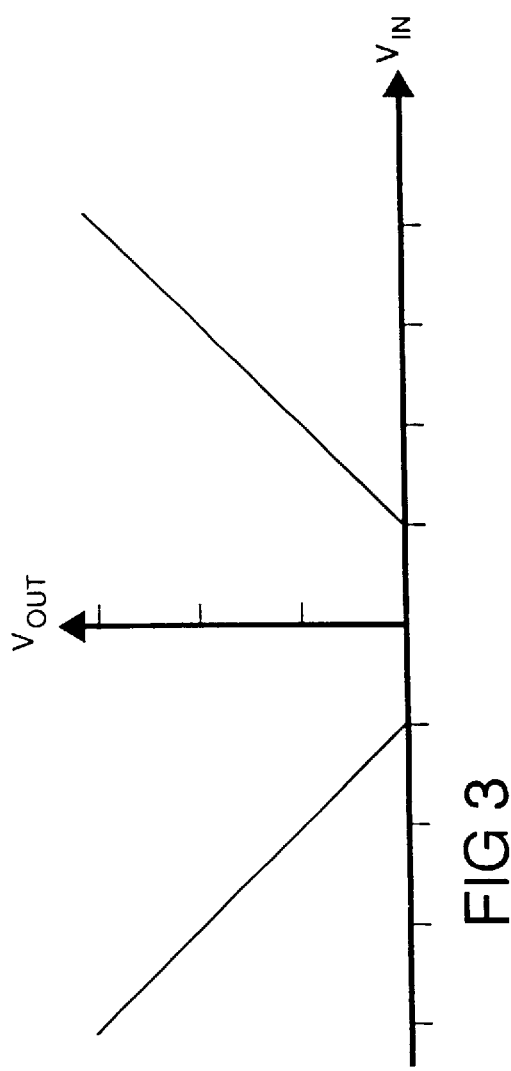
FIG. 3 is a plot of the input-output relationship for the full-wave rectifier of the embodiment of FIG. 1.

Since the polarity of the received noise impulses is random, the filtered signal is fed to full-wave rectifier 34, which converts all the impulses to the same polarity. Rectifier 34 may have a dead band in its input-output relationship, as shown in FIG. 3. As this dead band is made larger, the signal-to-noise ratio (as defined above) at the input of the noise detector is improved because the rectifier rejects progressively more low-level intentional and unintentional Q modulation. The dead band is preferably small enough so that low-level noise impulses are accepted to activate the noise blanker on low level noise greater than a predetermined threshold level.

At the output of rectifier 34, the noise spectrum is broadband, with peaks at the frequency of the AC power line (60 Hz in North America) and its harmonics. To separate the noise impulses from the remaining Q signal, the rectifier signal is filtered. Filter 36 passes the noise peaks, while rejecting energy spectra between these peaks. A narrow bandpass filter centered at 60 Hz may be used, or a series of such filters centered at 60 Hz and its harmonics.

Figure 5:
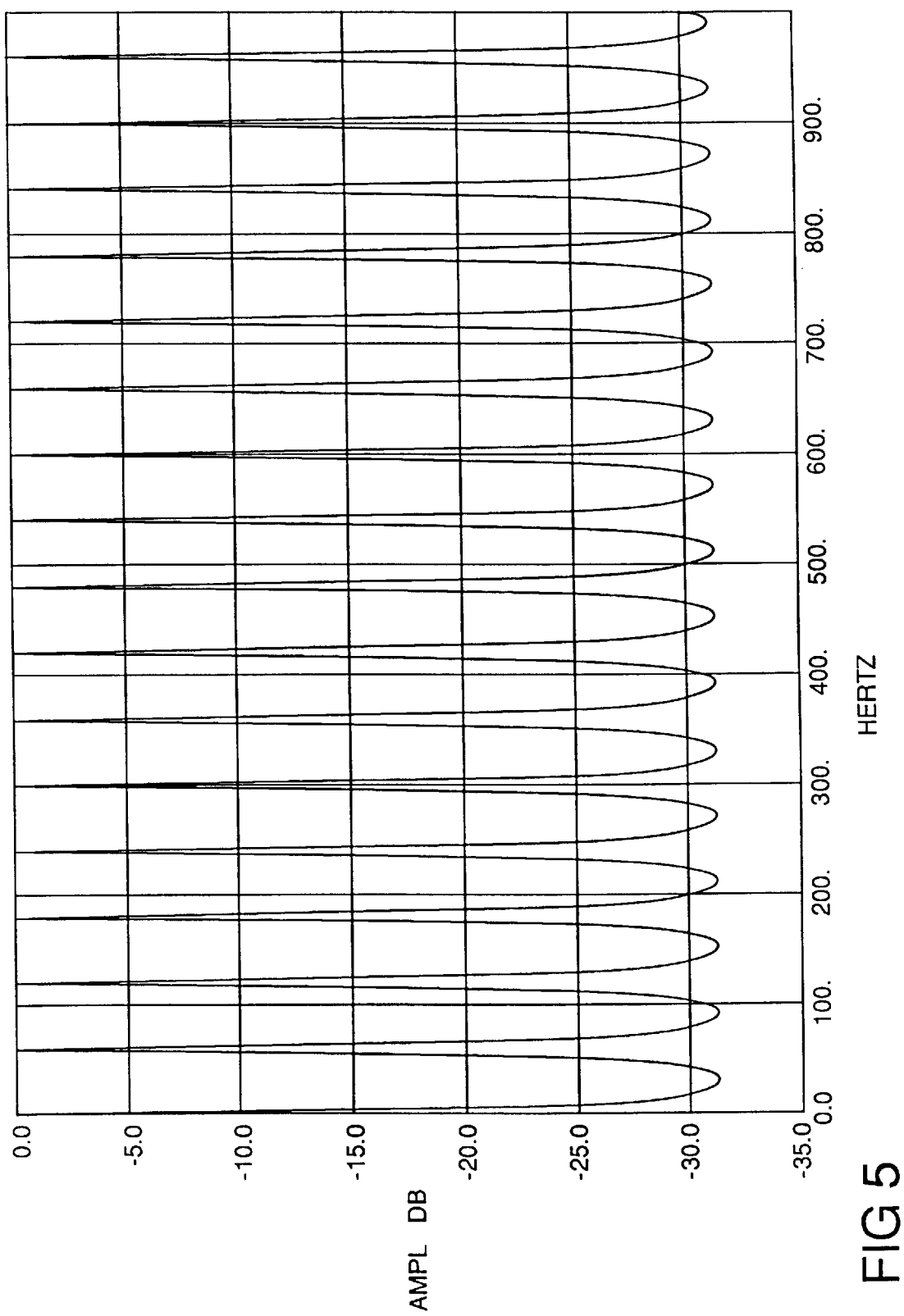
FIG. 5 is a plot of the frequency response of a filter of the type shown in FIG. 4.

A well known and cost effective comb filter can be constructed from the recirculating delay line 58 as shown in FIG. 4. An analog or digital delay line is clocked at a frequency $f_o$ 62 that controls the time delay τ. The frequency response of such a filter with K=0.95 is shown in FIG. 5. The bandwidth of the series of peaks can be adjusted by changing the gain K. As K approaches 1, the bandwidth around the peaks becomes smaller and smaller, rejecting more and more Q modulation. However, the response time of the filter becomes longer and longer, slowing the response time of the noise detector to changes in the character of the noise. K is selected to achieve a desired acceptable noise reduction.

The output of comb filter 61 is a slowly changing repetitive waveform having a period corresponding to the delay time r. The output has a high value at instances during the period of the AC power waveform when noise impulses are occurring, and a low value other times. Intentional and unintentional modulation of the Q channel may cause the comb filter output to rise and fall, but only sustained notes or tones at the AC power line frequency or its harmonics will cause a substantial change in the output level of the comb filter. Thus, the comb filter passes most of the desired noise signal while rejecting most of the undesired Q signal.

If comb filter 36 is not tuned exactly to the frequency of the AC power line, the output waveform of the filter will "crawl" slowly, at a rate corresponding to the difference in frequency between the comb filter pass frequency and the AC power line. A slight difference between the comb filter pass frequency and the AC power line frequency reduces the ability of noise detector 38 to sense noise because the noise signal spectrum is then not centered in the pass band of the filter. Since the AC power line frequency is typically tightly controlled, it is preferable to use a crystal oscillator to generate $f_o$ to set the center frequency of the comb filter. The better the stability of the comb filter crystal oscillator and of the AC power line frequency, the narrower the comb filter bandwidth may be for acceptable noise reduction.

Figure 16:
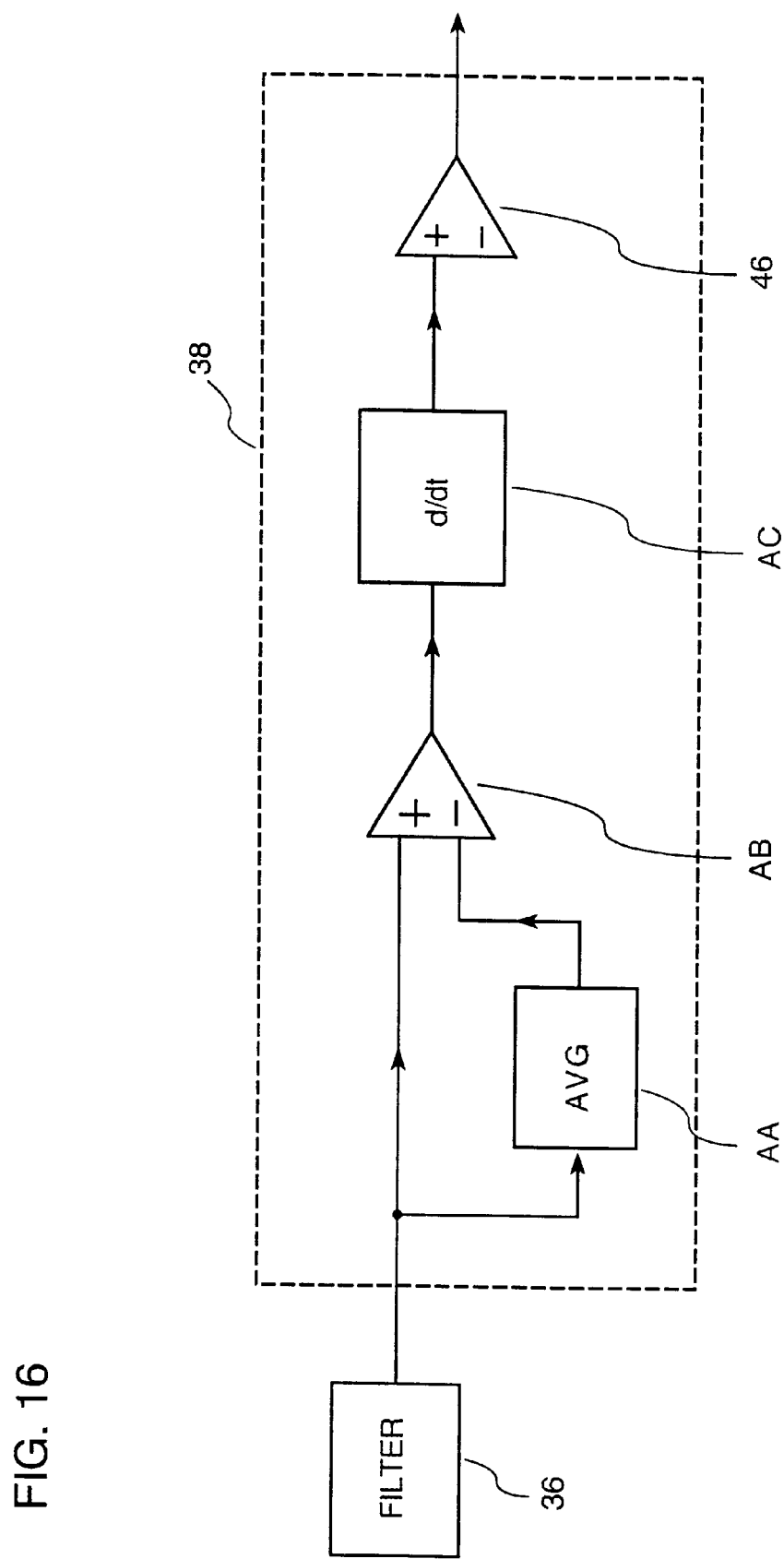
FIG. 16 is a block diagram showing the logical arrangement of a noise discriminator embodiment.

The output of the filter feeds noise detector circuit 38. This circuit may be level comparator 46, as shown in FIG. 2. When the output level of the comb filter exceeds some threshold 48, then noise is detected, and the comparator output changes from a low state to a high state for the duration of the noise impulse. A more sophisticated detector might first subtract the long-term time average level of the comb filter from the filter output, to eliminate drift problems, and then time differentiate the resulting waveform before feeding it to the comparator. Differentiating the signal accentuates the noise impulses, making them easier to detect. FIG. 16 is a block diagram showing the logical arrangement of this embodiment. Noise detector 38 comprises averaging circuit AA, summing amplifier AB, differentiator AC and comparator 46.

Figure 6A:
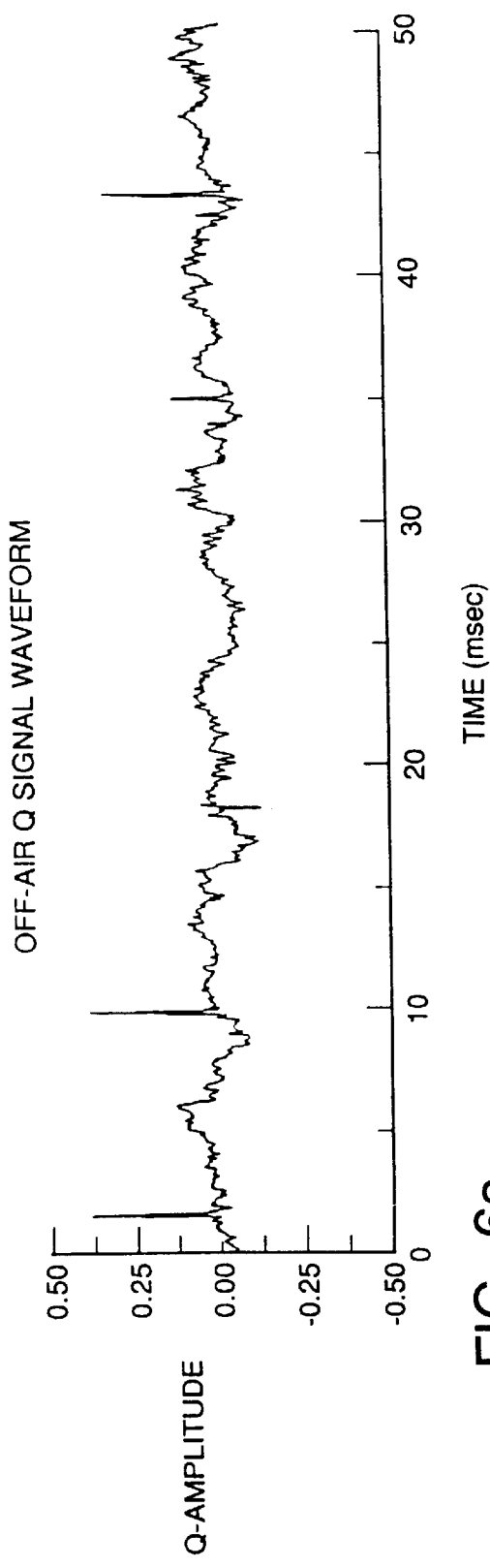
FIG. 6 is a plot of a typical off-the-air waveform and the resulting noise detector output.
Figure 6B:
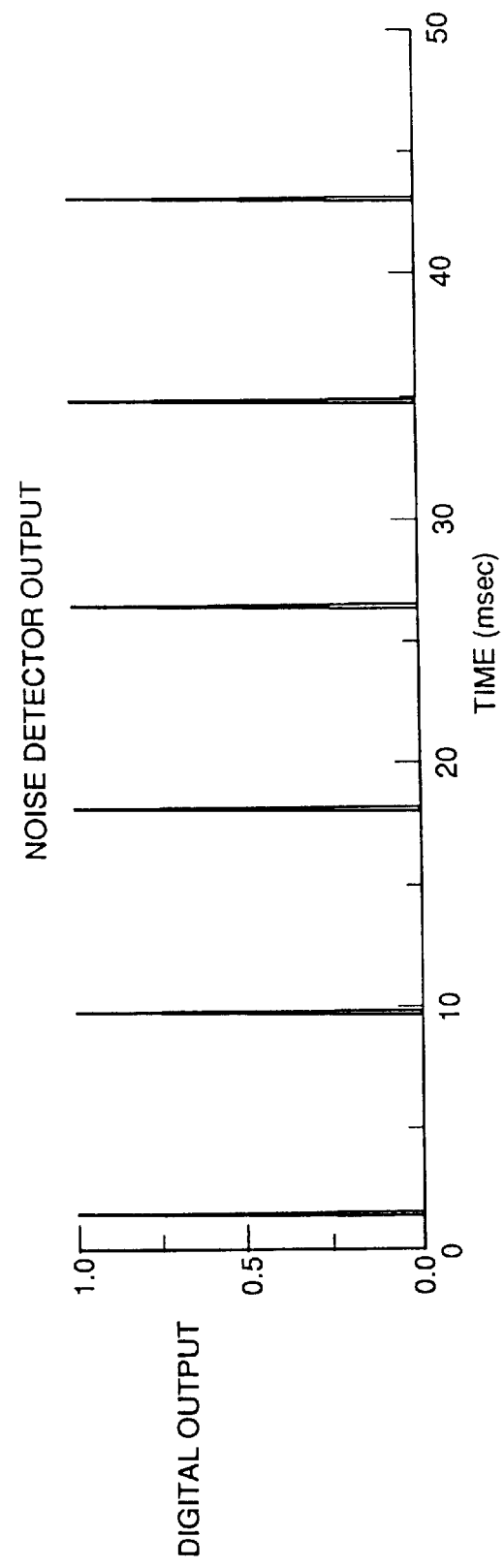

The output of comparator 46 is digital signal 50, which is high at the occurrence of each noise impulse, and low otherwise. This digital signal is synchronized with the noise impulses. Excepting for time delays in the processing circuits, the instances where the comparator output is high occur at the same time as the noise impulse is received. A typical off-the-air waveform is shown in FIG. 6. Since the station was broadcasting CQUAM stereo music at the time this waveform was recorded, there is substantial intentional Q modulation. Because of the random nature of the noise impulses, individual impulses may be too small to observe in the waveform, but this noise detector is still capable of sensing their presence. Even though the amplitude of an individual noise impulse may be small compared to the Q amplitude, it is preferably blanked because the same noise impulse may not be small compared to the I, L, or R outputs, due to the random nature of the impulses. Further, even though the average magnitude of the noise impulse is substantially less than 100% modulation, this noise detector can detect their presence.

Because of the synchronous nature of the noise detector, the comparator output 50 may be used to drive directly a synchronous style of noise blanker 26.

A wide variety of synchronous approaches may be used to reduce the audibility of the noise during the interval in which a noise impulse is detected. Typically the blanking action takes place at the output of the audio detector. For a simple monophonic receiver, the blanker may be connected to the output of the envelope detector. For a stereo receiver, there are preferably two blankers, one at each of the left and right channel audio outputs of the stereo decoder. For a receiver following the principles outlined in the earlier-mentioned co-pending application, there are preferably four noise blankers, operating on the I, Q, L and R detector outputs, as shown in FIG. 7. The noise blankers are preferably placed as close to the detector outputs as practical, so that subsequent signal processing does not time-stretch the noise impulses before they are blanked.

Figure 10:
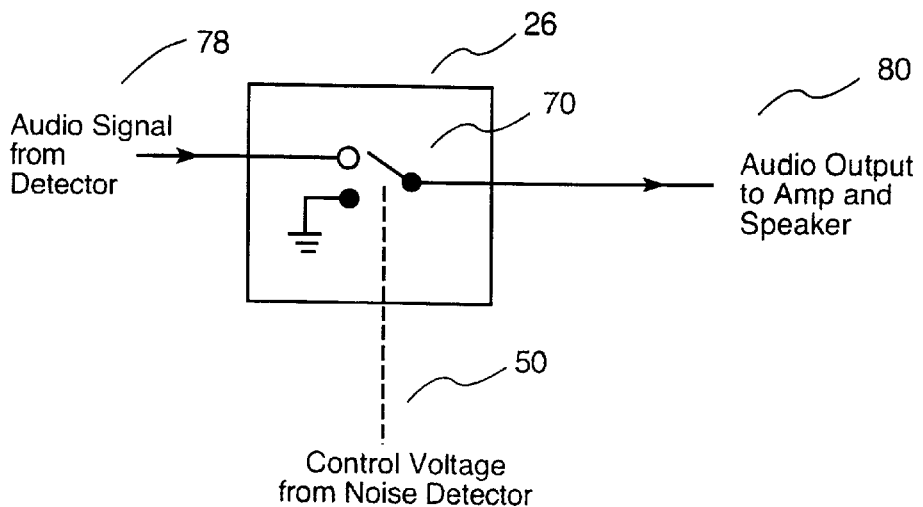
FIGS. 10–13 are exemplary embodiments of noise blankers.

The noise blanker may be one in which the detected audio output is set to zero during the duration of the noise impulse. This noise blanker is shown in FIG. 10. In the absence of noise, the control voltage on line 50 from the voltage detector holds switch 70 such that the audio detector output on line 78 passes through noise blanker 26. When noise is detected, switch 70 grounds the noise blanker output line 80, setting detected audio output to zero for the duration of the noise.

Figure 11:
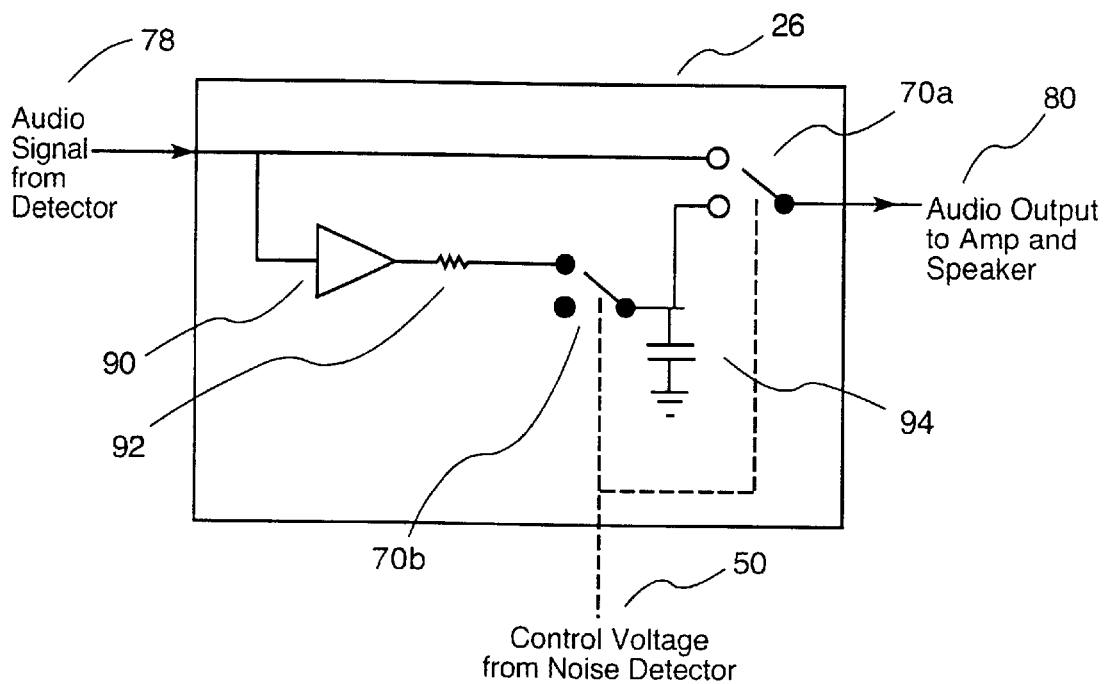
Figure 12:
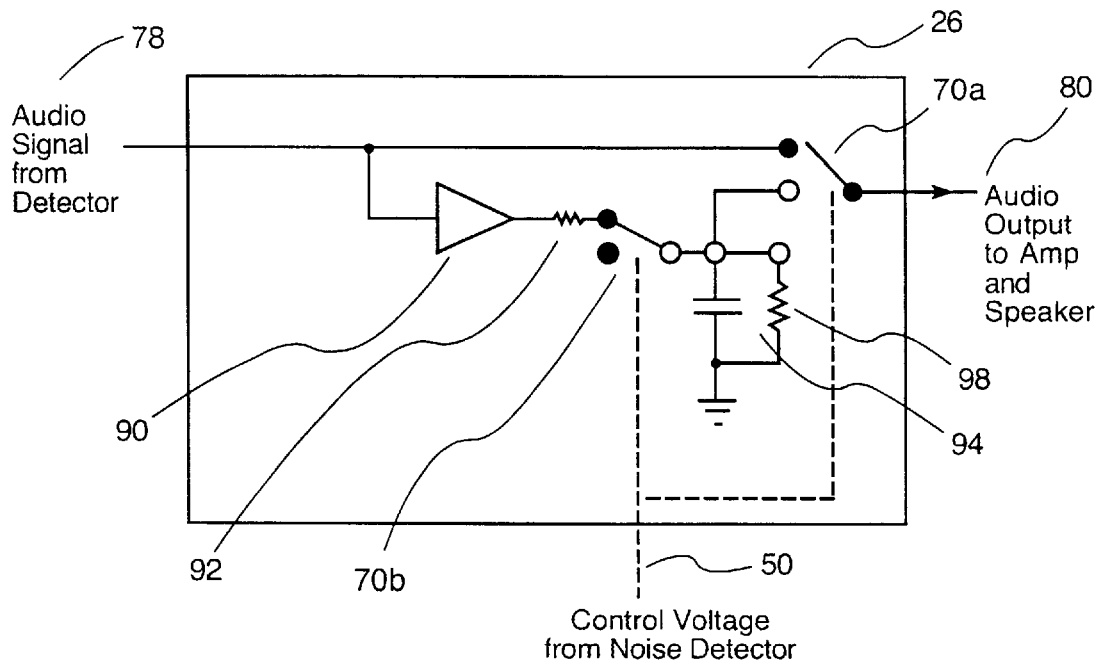
Figure 13:
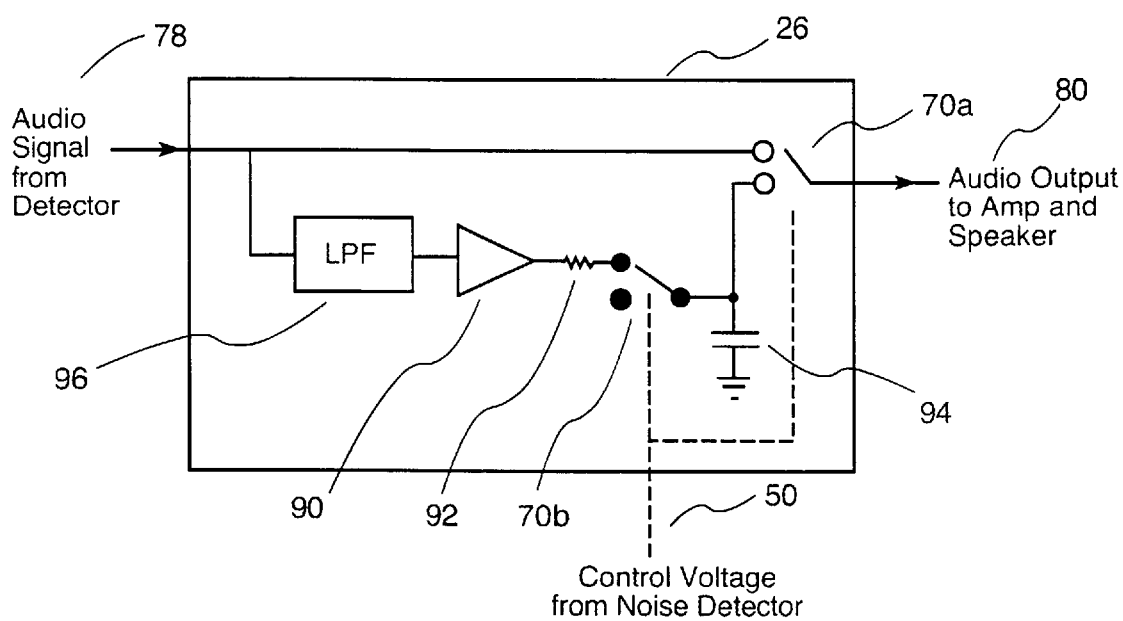

Referring to FIG. 11, there is shown another noise blanker that furnishes a slight improvement. In the absence of noise, the audio detector output on line 78 passes through noise blanker 26. Simultaneously, buffer amplifier 90 charges capacitor 94 through series resistor 92 to the instantaneous value of the audio detector output on line 78. When noise is detected, both switches 70a and 70b operate. Switch 70b disconnects capacitor 94 from the detector audio signal so that capacitor 94 maintains its voltage to be that of the detected audio signal at the instant before the noise. Meanwhile, the noise blanker output on line 80 receives the capacitor voltage on capacitor 94 through switch 70a for the duration of the noise. A slight improvement can be made by holding the detected audio output at a voltage equal to that of the detector output just prior to the noise impulse. This voltage is held for the duration of the impulse. This approach may result in an output transient when the hold is released, causing the output waveform to jump suddenly to the present detector output voltage. The transient may be reduced if the held voltage is relaxed (following, for example, an exponential curve) until its value equals that of the detector output. The time constant of the relaxation is preferably chosen to minimize the audibility of the transient, typically to be comparable in length to the duration of the noise impulse. This blanker is shown in FIG. 12 and operates in a manner similar to that of the blanker shown in FIG. 11. However, capacitor 94 is allowed to discharge through shunt resistor 98 so that the held capacitor voltage slowly relaxes during the operation of the blanker. A further refinement of this approach is to use a hold voltage equal to the low-pass-filtered value of the detector output at the onset of the impulse. Such an approach helps avoid a high, or otherwise inappropriate, value of held voltage due to some transient in the detector waveform occurring just prior to the noise impulse. This blanker is shown in FIG. 13. The operation of this blanker is similar to that of the blanker shown in FIG. 11. However, rather than following the instantaneous voltage of the detected audio signal on line 78, capacitor 94 follows the voltage of a low-pass-filter version of the detected audio. This version is created by passing the detected audio signal on line 78 through low pass filter 96, then feeding the filtered output through buffer amplifier 90, series resistor 92, switch 70b to capacitor 94.

Figure 14:
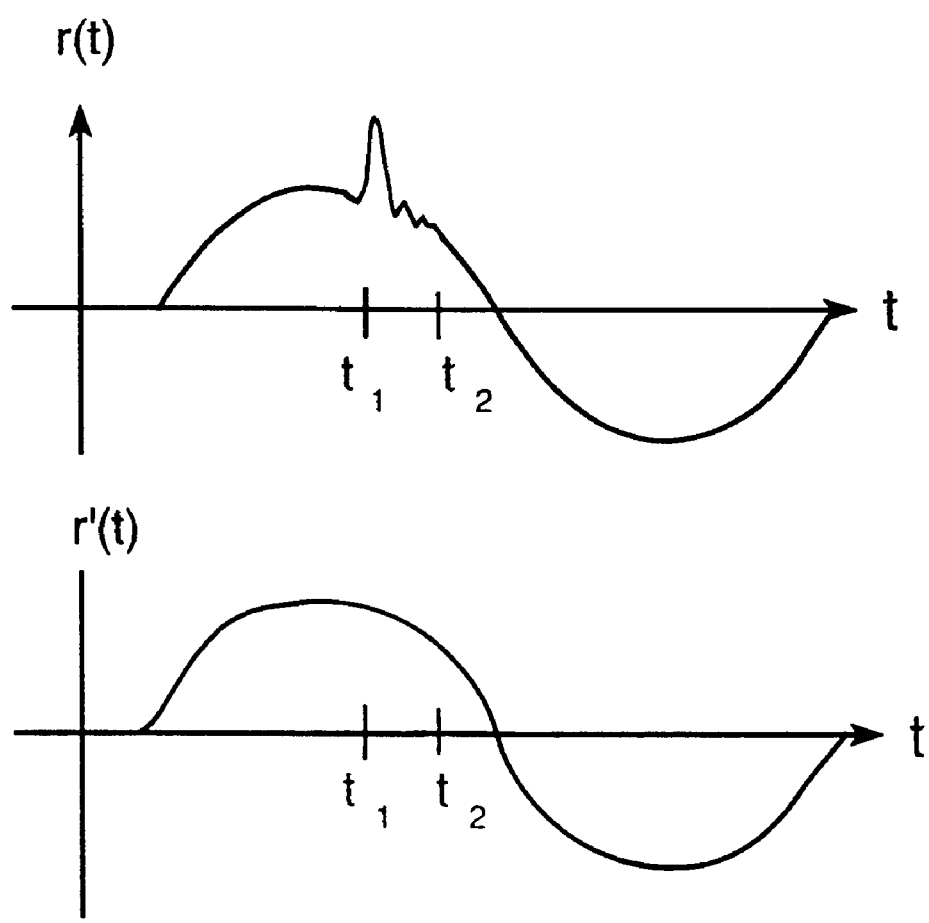
FIG. 14 is a graphical representacion of output audio waveforms of a blanker.

An interpolating system, though more costly, may be especially advantageous. Such a system replaces the detector output voltage during the noise impulse with a waveform consisting of a straight line (or other suitable approximation) connecting the detector output voltage just before and just after the noise impulse. Computer simulations have shown that a straight line interpolator results in a nearly inaudible transient, providing excellent concealment of the noise impulses. This blanker is normally implemented using digitized audio signals and a digital signal processor. The input and output audio waveforms of such a blanker are shown in FIG. 14. The upper waveform is a graphical representation of a typical received audio signal, r(t), which has been corrupted by noise in the region between $t_1$ and $t_2$. The control voltage from the noise detector activates at $t_1$ and deactivates at $t_2$. In the region between $t_1$ and $t_2$, the noise blanker replaces the received audio with a straight line connecting the points $r(t_1)$ and $r(t_2)$, as shown in the lower waveform of FIG. 14. This resulting waveform, r'(t), becomes the audio output that is fed to the power amplifier and speaker.

Figure 15:
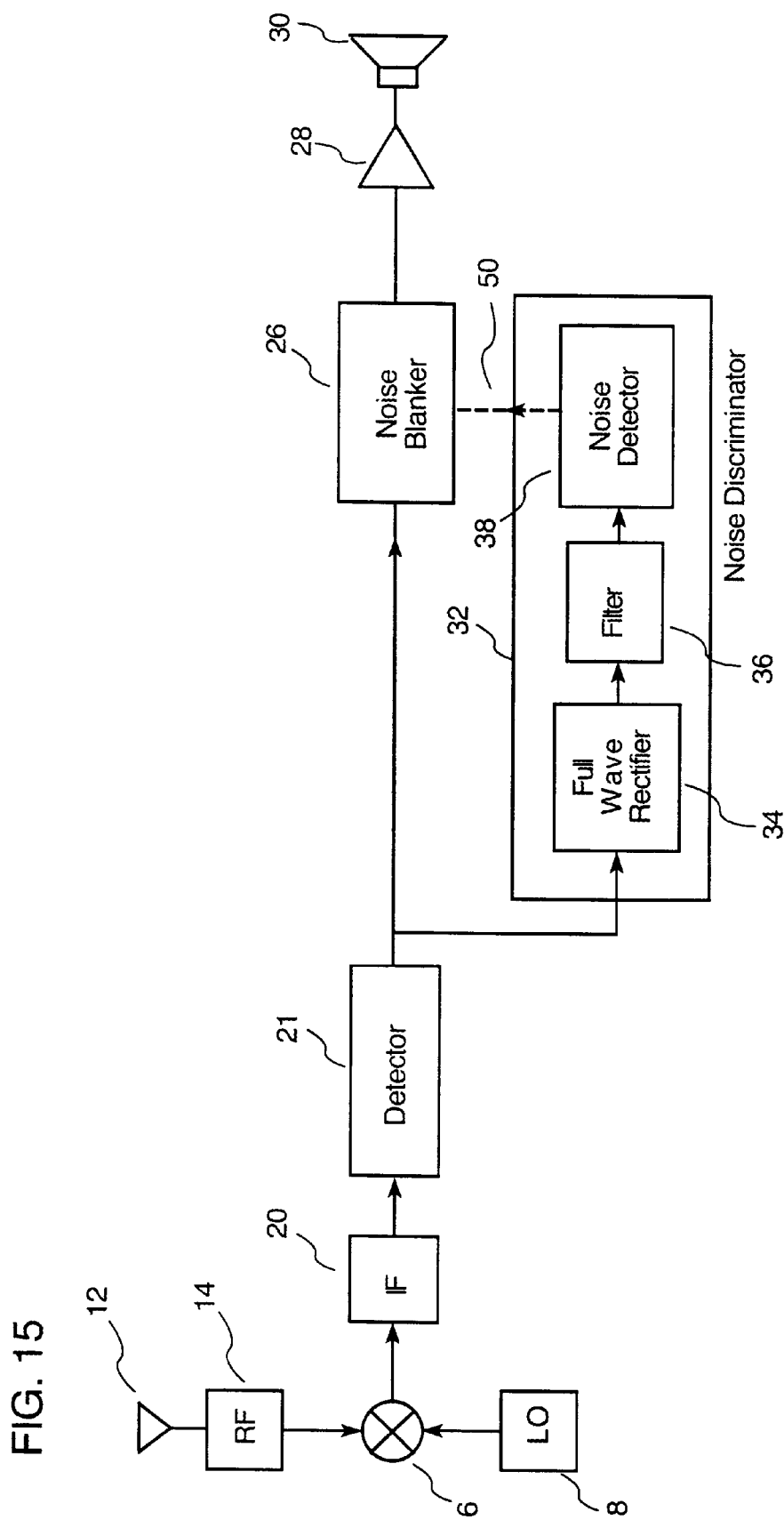
FIG. 15 is a block diagram disclosing an alternate embodiment of the invention using a single detector.

Referring to FIG. 15, there is shown an economical implementation of the invention embodying the approach discussed above on page 8, lines 32–36 and on page 17, lines 3–7, the details of how the noise detector is coupled to the filter being described from page 7, line 22 through page 8, line 12. A single detecting stage 21 feeds both noise blanker and noise discriminator 32.

A novel and more economical system that works nearly as well is shown in FIG. 8. The AM audio detector output 78 feeds an all-pass filter 74 and a low-pass filter 76 having the same order and cutoff frequency, resulting in the two filters having essentially identical phase responses over the audible band. A typical low-pass filter for this application has two real poles at 1000 Hz. When no noise impulse is detected, blanker switch 70 selects the output of all-pass filter 74. When a noise impulse is detected, the blanker selects the output of low-pass filter 76 for the duration of the impulse. Thus, the high frequency energy of the noise pulse is filtered out by the blanker, and the audibility of the noise impulse is substantially reduced.

For audio signals below 1000 Hz, the response of the blanker is the same with switch 70 in either position. Thus, no transient is introduced when the switch is operated for signals below 1000 Hz. Signals above 1000 Hz pass freely when the all-pass filter output is selected, and are substantially blocked when the low-pass filter output is selected. For signals in this frequency band, a transient may be introduced by the operation of the switch. While an audible transient is introduced by the switching action, it occurs only for some signals, and thus it is substantially less audible than some of the simpler blanking approaches discussed above.

If the cutoff frequency of the filters is decreased, more noise energy is removed, but more artifact is introduced by the blanking action. If it is increased, the blanker is less effective at removing the noise. The cutoff frequency is chosen to provide adequate noise blanking with acceptable level of artifact.

Because of time delays in the noise detection system, it may be desirable to time-delay the audio signal at the input of the blanker by an equivalent amount. Various time delay circuits may be used, or all-pass filter approximations to time delay may be used. In addition, because of the filters that may be used in the noise blanker, it may be desirable to stretch the noise detector pulses that operate the noise blanker.

The noise blanking systems described above all operate synchronously. It is also possible to reduce the audibility of the noise using a system which operates more slowly, and remains active not just for each individual noise pulse, but over the entire duration of a sequence of noise pulses. One such asynchronous action is low-pass filtering. While a series of noise impulses are being received, the audio bandwidth of the receiver may be reduced to a low value, sufficient to allow intelligibility of speech, but low enough to reduce the audibility of the noise impulses.

Referring to FIG. 9, an example of such a system includes low-pass-filtering the detected audio signal after the action of the synchronous noise blankers, should they be used. The analog output of the noise discriminator comb filter may be used to set the bandwidth of a continuously variable low-pass filter 88 through which the audio passes. Alternatively, low-pass filter 88 may be driven by a voltage dependent on the duty cycle of the noise detection pulse. A low duty cycle, indicative of only a single noise impulse per cycle of the AC power waveform would not cause the audio bandwidth to be significantly reduced. However, as the duty cycle increased, indicating more and more noise impulses per period, the filter bandwidth is reduced to help further reduce the audibility of the noise.

For a receiver using several audio detectors, such as a CQUAN stereo system, a separate low-pass filter is preferably placed after the output of each detector. For a receiver incorporating the "monkey chatter"-reduction features of the earlier-referenced co-pending application, and partially shown in FIG. 7, the low-pass filters are preferably in the left and right channel audio outputs, after the circuitry to reduce audible "monkey chatter." The voltage-controlled low-pass filters for reducing audible "monkey chatter" may also be used to reduce the audibility of noise impulses. The control voltage from the monkey chatter circuitry, and the control voltage from the noise discriminator may be compared, and the voltage indicating the lower filter cutoff frequency may control the low-pass filters.

It has been observed that when a receiver according to the invention is tuned to a weak station where a stronger station is closely located in frequency, signals from both stations are present in the RF stage, but the stronger station may determine the 100% modulation level. Because the above-described noise-blanking methods do not depend on the 100% modulation level, noise pulses may still be effectively reduced in this situation with the invention.

Figure 17:
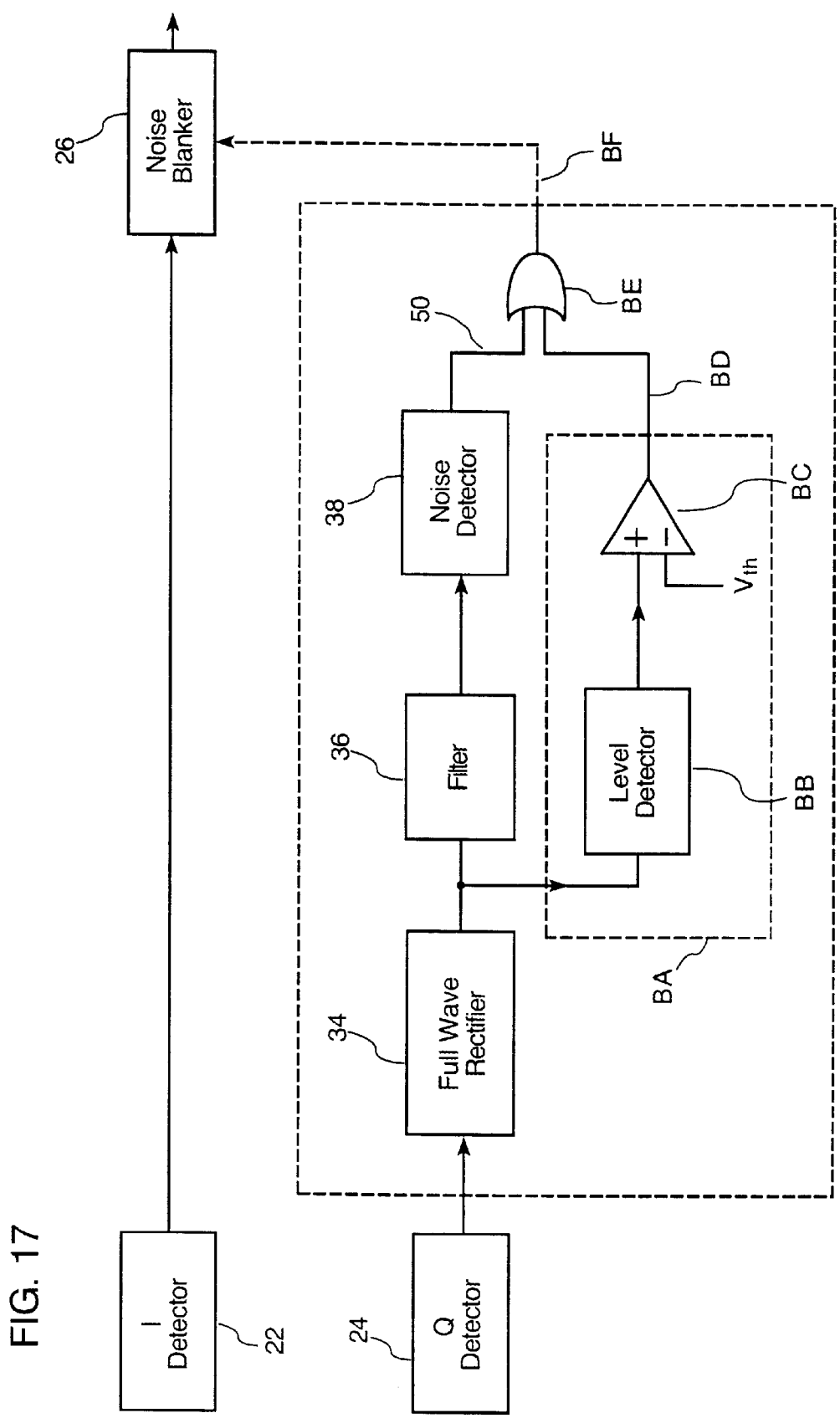
FIG. 17 is a block diagram showing the logical arrangement of a second blanking system.

The noise discriminator described above may be combined with other noise detectors to obtain the benefits of all. For example, a noise detector sensing modulation levels in excess of 100% can be combined with the noise discriminator described above by logically OR-ing the two noise detector outputs. The combined signal may be used to operate any of the noise blankers described above, as well as the variable low-pass filter. A noise detector which responds to impulses with random timing, such as those due to lightning discharges, may be combined with the noise discriminator which responds to power line noise, even at low levels, to reduce audible effects of both types of noise. FIG. 17 is a block diagram showing the logical arrangement of a second blanking system. Full-wave rectifier 34 feeds both filter 36 and an additional noise detector BA. Noise detector BA consists of level detector BB feeding comparator BC. The comparator output BB is logically or-ed with the output 50 of noise detector 38 using OR gate BE, and the resulting signal drives noise blanker 26 on line BF. Thus, repetitive noise at low amplitudes, as well as noise having a noise amplitude greater than some nominal amount over ±100% modulation results in activation of the noise blanker.

An important aspect of the invention involves detecting the presence of repetitively occurring random noise signals. The invention may sense these repetitive noise signals in any detected signal, including E, I, Q, L or R as stated above. The invention processes a detected signal to enhance the repetitive noise signal portions, typically including filtering. The invention examines the signal thus processed for the presence of undesired noise components.

One inexpensive embodiment of a system incorporating the invention may comprise a monophonic AM receiver having only an envelope detector. The noise discriminator and noise blanker may then both operate on the detected envelope or E signal.

Other embodiments are within the scope of the following claims.

What is claimed is:

1. A noise reducing AM receiver comprising, a receiving stage for receiving an AM signal of carrier frequency separated from that in an adjacent channel by a predetermined spacing and that may have a noise component, a detecting stage coupled to said receiving stage for detecting at least a first portion of the received AM signal, a filter coupled to said detecting stage for extracting a spectral component from at least a first portion of said received AM signal, a noise detector coupled to said filter for detecting the presence of a predetermined amount of noise in said spectral component and for providing a blanking control signal in the presence of at least said predetermined amount of noise, and a first noise blanker responsive to said blanking control signal to process at least one portion of said received signal in response to said control signal to reduce the audibility of said noise component.

2. The receiver of claim 1 wherein said detecting stage is constructed and arranged to generate a detected quadrature signal and a detected in-phase signal from said received AM signal, and to provide them respectively to said filter as said first portion and to said noise blanker as said one portion.

3. The receiver of claim 1 further comprising a rectifier coupled to said detecting stage and for providing a rectified output to said filter.

4. The receiver of claim 3 further comprising a band-reject filter coupled to said detecting stage and for providing a band-filtered output to said rectifier.

5. The receiver of claim 4 wherein said band-reject filter is characterized by a center frequency the same as the said predetermined spacing.

6. The receiver of claim 1 wherein said noise detector comprises a source of a threshold signal and a comparator coupled to said filter and responsive to said threshold signal to provide said blanking control signal when said predetermined amount of noise is exceeded.

7. The receiver of claim 2 wherein said filter comprises a recirculating delay line.

8. The receiver of claim 7 wherein said recirculating delay line is analog.

9. The receiver of claim 7 wherein said recirculating delay line is digital.

10. The receiver of claim 1 wherein said filter is tuned to a local AC line frequency.

11. The receiver of claim 1 wherein said filter is tuned to a local AC line frequency and its harmonics.

12. The receiver of claim 2 wherein said detecting portion is further constructed and arranged to generate detected left and right stereo portions of said AM signal, and wherein said receiver further comprises second, third and fourth noise blankers, responsive to said first, right and left portions respectively, said second, third and fourth noise blankers being responsive to said blanking control signal to process their respective portions of said signal and provide processed versions of said first, right and left portions to reduce the audibility of said noise component.

13. The receiver of claim 1 wherein said noise blanker comprises
   a signal input coupled to said detecting stage,
   a control input for receiving said blanking control signal,
   an all-pass filter responsive to said signal input and including an all-pass output, said all-pass filter being adapted to filter at least said second portion of said received signal and to provide a resulting all-pass filtered signal on said all-pass output,
   a low-pass filter coupled to said signal input and including a low-pass output, said low-pass filter being adapted to filter at least said second portion of said received signal and provide a resulting low-pass filtered signal on said low-pass output, and
   a switch coupled to said control input, said low-pass output, and said all-pass output, said switch being adapted to select between said all-pass and said low-pass outputs in response to said blanking control signal to provide a reduced bandwidth output in the presence of at least said predetermined amount of noise.

14. The receiver of claim 1, further comprising an adjustable filter responsive to said blanking control signal, said adjustable filter being for filtering at least said second portion of said signal to reduce the bandwidth of at least said second portion of said signal in response to the level of noise present in at least said first portion.

15. The receiver of claim 14, wherein said adjustable filter comprises a voltage controlled filter and further comprising a control voltage generator responsive to said blanking control signal, for providing a control voltage to said voltage controlled filter.

16. The receiver of claim 1, wherein said noise detector includes a comparator and circuitry that first subtracts the long-term time average level of the output signal from said filter from the contemporary output signal of said filter to provide a difference signal and then time differentiates said difference signal to provide a differentiated difference signal coupled to said comparator.

17. The receiver of claim 1 wherein said AM signal may normally achieve a 100% modulation level, further including a second blanking system responsive to noise pulses exceeding said 100% modulation level and in response thereto processing at least a second portion of said received signal.

18. The receiver of claim 1, wherein said first blanker includes signal interpolation circuitry.

19. The receiver of claim 18, wherein said blanker includes linear signal interpolation circuitry.

20. The receiver of claim 1 wherein said blanker includes circuitry sampling and holding at least said second portion of said received signal.

21. The receiver of claim 20 wherein said blanker includes circuitry sampling and holding at least said second portion of said received signal based on a low-pass filtered version of the second portion of said received signal.

22. The receiver of claim 1 wherein said blanker includes circuitry setting at least said second portion of said received signal to a zero level.

23. The receiver of claim 1 wherein said noise component includes noise pulses and said noise detector provides a control signal that is dependent on the duty cycle of the received noise pulses.

24. The receiver of claim 1 wherein said detecting stage is an envelope detector for detecting the envelope of the received AM signal and said at least one portion is said first portion.

25. The receiver of claim 2 wherein said detecting portion is further constructed and arranged to generate detected left and right stereo portions of said AM signal, and wherein said receiver further comprises a second noise blanker, responsive to said first portion, said second noise blanker being responsive to said blanking control signal to process said first portion of said signal and provide a processed version of said first portion to reduce the audibility of said noise component.

26. A noise reducing AM receiver comprising,
   a receiving stage for receiving an AM signal of carrier frequency separated from that in an adjacent channel by a predetermined spacing,
   a quadrature detector coupled to said receiving stage for detecting a quadrature signal from said received AM signal,
   an in-phase detector coupled to said receiving stage for detecting an in-phase signal from said received AM signal,
   a band-reject filter coupled to said quadrature detector for providing a filtered version of said quadrature signal, said band-reject filter characterized by a center frequency corresponding to said predetermined spacing,
   a full-wave rectifier coupled to said band-reject filter for rectifying said filtered version of said quadrature signal,
   a comb filter coupled to said full-wave rectifier, said comb filter including a recirculating delay line and being tuned to a local AC line frequency and its harmonics,
   a noise detector coupled to said comb filter for detecting the presence of a predetermined amount of noise in the signal passed by said comb filter for providing a blanking control signal in the presence of at least said predetermined amount of noise, said noise detector including a source of a threshold signal representative of said predetermined amount of noise and a comparator coupled to said comb filter and to said source of a threshold signal, and
   a first noise blanker responsive to said blanking control signal to process said in-phase signal, said first noise blanker including an all-pass filter and a low-pass filter coupled to said in-phase detector, and a switch for selecting between said low-pass filter and said all-pass filter in response to said blanking control signal in order to process said in-phase signal by providing a reduced bandwidth output signal in the presence of at least said predetermined amount of noise.

27. The receiver of claim 26, further comprising
   a control voltage generator responsive to said blanking control signal and for generating a control voltage, and
   a voltage-controlled filter responsive to said control voltage and said in-phase signal, said voltage-controlled filter being for filtering said in-phase signal in order to reduce the bandwidth of said in-phase signal in response to the level of noise present in said in-phase signal.

28. The receiver of claim 26 further including left and right signal detectors for detecting left and right stereo signals from said AM signal, and wherein said receiver further comprises second, third and fourth noise blankers, responsive to said quadrature, right and left signals respectively, said second, third and fourth noise blankers being responsive to said blanking control signal to process their respective signals and to provide processed versions of said first, right and left portions for further processing.

29. The receiver of claim 26 wherein said AM signal may normally achieve a 100% modulation level, further including a second blanking system responsive to noise pulses exceeding the 100% modulation level and in response thereto processing at least said in-phase signal.

30. The receiver of claim 26 wherein said recirculating delay line is analog.

31. The receiver of claim 26 wherein said recirculating delay line is digital.

32. The receiver of claim 26 wherein said detecting portion is further constructed and arranged to generate detected left and right stereo portions of said AM signal, and wherein said receiver further comprises a second noise blanker, responsive to said first portion, said second noise blanker being responsive to said blanking control signal to process said first portion of said signal and provide a processed version of said first portion to reduce the audibility of said noise component.

33. A noise reducer, comprising a signal input for receiving an input signal, a control input for receiving a blanking control signal, an all-pass filter coupled to said signal input and including an all-pass output, said all-pass filter being adapted to filter said input signal and provide a resulting all-pass-filtered signal on said all-pass output, a low-pass filter coupled to said signal input and including a low-pass output, said low-pass filter being adapted to filter said input signal and provide a resulting low-pass-filtered signal on said low-pass output, and a switch coupled to said control input, said low-pass output and said all-pass output, said switch being adapted to select between said all-pass and said low-pass outputs in response to the blanking control signal to provide a reduced bandwidth output in the presence of said blanking control signal.

34. A noise blanking AM receiver comprising, a receiving stage for receiving an AM signal of carrier frequency separated from that in an adjacent channel by a predetermined spacing, a detecting stage coupled to said receiving stage for detecting at least a first portion of the received AM signal that may have noise, a noise discriminator coupled to said detecting stage for providing an indication of the presence of noise in at least a first portion of said received AM signal, and an adjustable filter coupled to said noise discriminator for filtering at least a second portion of the received AM signal to reduce the bandwidth of at least said second portion in response to the level of noise present in at least said first portion.

35. The receiver of claim 34, wherein said adjustable filter is a voltage controlled filter and further comprising a control voltage generator responsive to said indication, for providing a control voltage to said voltage controlled filter.

36. The receiver of claim 35 wherein said noise includes noise pulses and said control voltage generator provides a control voltage that is dependent on the duty cycle of received noise pulses.

37. A method of processing an AM signal comprising the steps of:

filtering at least a first portion of said AM signal to obtain a predetermined spectral range of said signal, detecting the noise present within said predetermined spectral range, and processing at least one portion of said AM signal in response to the detection of a predetermined amount of noise in said spectral range wherein said filtering step selectively passes a spectral of frequency related to a local AC line frequency.

38. The method of claim 35, wherein said processing step includes choosing between a low-pass-filtered version and an all-pass filtered version of said one portion.

39. A method of processing a received AM signal comprising the steps of:

providing a low-pass-filtered version of the received AM signal, providing an all-pass-filtered version of the received AM signal, and selecting said all-pass-filtered version during normal operation, and selecting said low-pass-filtered version in the presence of a predetermined amount of noise during abnormal operation.

40. The method of claim 37 wherein said one portion is said first portion.

* * * * *